United States Patent
Kuroki

(10) Patent No.: US 7,252,926 B2
(45) Date of Patent: Aug. 7, 2007

(54) PLANOGRAPHIC PRINTING PLATE MATERIAL AND PREPARING PROCESS OF PLANOGRAPHIC PRINTING PLATE

(75) Inventor: Takaaki Kuroki, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 68 days.

(21) Appl. No.: 11/006,169

(22) Filed: Dec. 7, 2004

(65) Prior Publication Data

US 2005/0153237 A1     Jul. 14, 2005

(30) Foreign Application Priority Data

Dec. 19, 2003  (JP) .............................. 2003/422482

(51) Int. Cl.
*G03F 7/004*    (2006.01)
(52) U.S. Cl. .............................. 430/270.1; 430/283.1; 430/905; 430/913; 430/302
(58) Field of Classification Search ............. 430/270.1, 430/283.1, 905, 913, 302
See application file for complete search history.

(56) References Cited

U.S. PATENT DOCUMENTS

| | | | |
|---|---|---|---|
| 4,842,980 A * | 6/1989 | Gottschalk et al. | 430/138 |
| 4,983,498 A * | 1/1991 | Rode et al. | 430/284.1 |
| 5,049,479 A * | 9/1991 | Zertani et al. | 430/271.1 |
| 2004/0091816 A1 | 5/2004 | Matsumura et al. | |
| 2004/0157154 A1 | 8/2004 | Kuroki et al. | |
| 2004/0191691 A1 | 9/2004 | Ohta et al. | |
| 2005/0048403 A1 | 3/2005 | Kuroki | |

FOREIGN PATENT DOCUMENTS

| | | |
|---|---|---|
| EP | 1 413 925 A2 | 4/2004 |
| EP | 1 445 653 A1 | 8/2004 |
| EP | 1 452 916 A2 | 9/2004 |
| EP | 1 513 015 A | 3/2005 |
| JP | 01-152109 A | 6/1989 |
| JP | 02-127404 A | 5/1990 |
| JP | 10-104835 A | 4/1998 |

OTHER PUBLICATIONS

English language machine translation of JP 10-104835.*

* cited by examiner

*Primary Examiner*—Amanda Walke
(74) *Attorney, Agent, or Firm*—Frishauf, Holtz, Goodman & Chick, P.C.

(57) ABSTRACT

A planographic printing plate material including a support having thereon a photosensitive layer containing: (A) a photopolymerization initiator; (B) a polymer binder; (c) a polymerizable compound having an ethylenically unsaturated bond; and (D) an anionic dye, wherein the photopolymerization initiator is a metal-arene complex, and the anionic dye has a solubility in methyl ethyl ketone of not less than 1 weight % based on the total weight of methyl ethyl ketone.

6 Claims, No Drawings

PLANOGRAPHIC PRINTING PLATE MATERIAL AND PREPARING PROCESS OF PLANOGRAPHIC PRINTING PLATE

FIELD OF THE INVENTION

The present invention relates to a planographic printing plate material of a photopolymerization type used for a computer to plate system (hereafter it is called as a CTP system) and to a preparation method employing the same. More particularly, the present invention relates to a planographic printing plate material of a photopolymerization type which improves a storage stability, a performance stability and developing properties, and also to a method of preparing a planographic printing plate employing the same.

BACKGROUND OF THE INVENTION

In recent years, as a printing plate for off-set printing, a large number of computer to plate (CTP) systems have been developed and put into practical use, which imagewise exposes directly to a planographic printing plate material employing laser light based on digital image data to record an image on the material.

Among them, in a printing plate making field in which a fairly high printing durability is required, it is known a negative type planographic printing plate material having a photosensitive layer containing a polymerizable compound (e.g., Patent document No. 1).

It is known a material having a photosensitive layer containing an iron-arene complex as a polymerization initiator so as to achieve a high sensitivity (e.g., Patent document No. 2). Further, it is also known a photosensitive layer containing a photo-reductive colorant such as a metallocene compound, a trihalogenated methyl compound, or a xanthene compound in order to achieve a high sensitivity, and a high printing durability (e.g., Patent document No. 3).

The printing plate materials having the above-described photosensitive layer exhibit relatively high sensitivity, however, they tend to show deterioration of the performance after a long-term storage and they are not fully satisfactory for the storage property.

On the other hand, for a printing plate material having a radical polymerization photosensitive layer, a preferred method for preparing a printing plate employs a thermal treatment (pre-heating) after imagewise exposure of the material before development in order to achieve a high printing durability.

However, the above-method is not fully satisfactory because it is required to control the pre-heating condition and a latitude of temperature for pre-heating is not large enough.

Further, the above negative-working photopolymerization type printing plate material has a problem in that sludge is likely to be produced in a developer, and does not have a fully satisfactory running property for a long-term development processing.

Patent document No. 1: Japanese Patent Publication Open to Public Inspection (JP-A) No. 10-104835
Patent document No. 2: JP-A NO. 1-152109
Patent document No. 3: JP-A NO. 2-127404

SUMMARY OF THE INVENTION

An object of the invention is to provide a planographic printing plate material exhibiting high sensitivity, high printing durability, long shelf life, good developing property and good preheating latitude after imagewise exposure of the material and a process of preparing a planographic printing plate-employing the same.

These and other objects of the present invention are accomplished by a planographic printing plate material including a support having thereon a photosensitive layer containing:

(A) a photopolymerization initiator;
(B) a polymer binder;
(c) a polymerizable compound having an ethylenically unsaturated bond; and
(D) an anionic dye, wherein the photopolymerization initiator is a metal-arene complex, and the anionic dye has a predetermined solubility in methyl ethyl ketone.

DESCRIPTION OF THE PREFERRED EMBODIMENTS

The preferred embodiments of the present invention are as follows.

(1) An embodiment of the present invention includes a planographic printing plate material including a support having thereon a photosensitive layer containing:

(A) a photopolymerization initiator;
(B) a polymer binder;
(c) a polymerizable compound having an ethylenically unsaturated bond; and
(D) an anionic dye, wherein the photopolymerization initiator is a metal-arene complex, and the anionic dye has a solubility in methyl ethyl ketone of not less than 1 weight % based on the total weight of methyl ethyl ketone.

(2) Another embodiment of the present invention includes a planographic printing plate material of Item 1, wherein the anionic dye is represented by Formula (1):

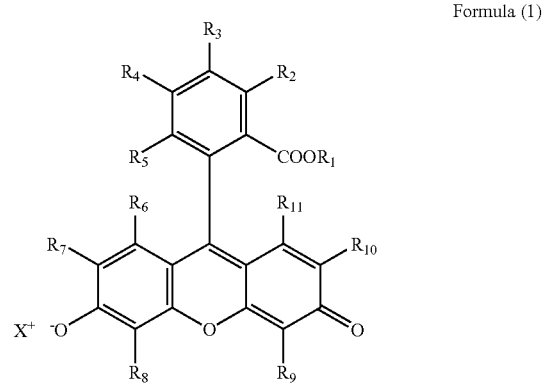

Formula (1)

wherein $R_1$ represents a substituted or unsubstituted alkyl group of 1 to 18 carbon atoms, or a substituted or unsubstituted aryl group; $R_2$ to $R_{11}$ each independently represents a hydrogen atom, F, Cl, I, Br, a substituted or unsubstituted alkyl group of 1 to 6 carbon atoms, a substituted or unsubstituted aryl group or $—N(R_{12})(R_{13})$, provided that $R_{12}$ and $R_{12}$ each independently represents a substituted or unsubstituted alkyl group of 1 to 6 carbon atoms, or a substituted or unsubstituted aryl group; and $X^+$ represents a hydrogen cation, a monovalent alkali metal cation or an onium cation.

(3) Another embodiment of the present invention includes a planographic printing plate material of Item 2, further contains a polyhalogenated compound in the photosensitive layer as another photopolymerization initiator in (A).

(4) Another embodiment of the present invention includes a planographic printing plate material of Item 3,
wherein the polyhalogenated compound contains in the molecule:
a polyhalogenated acetyl amide group; or
an oxadiazole ring having a polyhalogenated methyl group.

(5) Another embodiment of the present invention includes a planographic printing plate material of any one of Items 1 to 4,
wherein the polymer binder in (B) is an alkali soluble polymer having an acid value of 30 to 200.

(6) Another embodiment of the present invention includes a planographic printing plate material of any one of Items 1 to 5,
wherein the polymerizable compound in (C) contains a tertiary amino group in the molecule.

(7) Another embodiment of the present invention includes a method of preparing a planographic printing plate comprising the steps of:
(i) imagewise exposing the planographic printing plate material of any one of Items 1 to 6 to a laser having an emission wavelength in the range of 400 to 600 nm;
(ii) heating the imagewise exposed planographic printing plate material at a temperature of 80 to 150° C. for 3 to 30 seconds; and
(iii) developing the heated planographic printing plate material with an alkali developer having a pH of 10 to 12.5.

The present invention can provide a planographic printing plate material exhibiting high sensitivity, high printing durability, with small amount of decrease in sensitivity and deterioration of printing aptitude under a high humid storage condition, resulting in stable development for long term and expanding the latitude of heating treatment after imagewise exposure. The present invention also provides a method for making a printing plate using the same planographic printing plate material.

The present invention will be detailed below.

The planographic printing plate material of the present invention is characterized in that it comprises a polymerizable photosensitive layer containing a composition of a metal-arene complex and a specific anionic dye.

The photosensitive layer of the present invention contains a metal-arene complex as a polymerization initiator and further an anionic dye which dissolves in methyl ethyl ketone in an amount of not less than 1 wt %.

(A) Photoinitiator

A photoinitiator is a compound capable of initiating polymerization of (c) a polymerizable compound having an ethylenically unsaturated bond by imagewise exposure.

In the present invention, a photosensitive layer is required to contain a metal-arene complex. A photoinitiator may be used in combination with the metal-arene complex.

(Metal-Arene Complex)

A metal-arene complex used in the present invention is a compound represented by Formula (a).

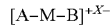

Formula (a)

wherein A represents a cyclopentadienyl group or an alkyl substituted cyclopentadienyl group; B represents an aromatic group; $X^-$ represents an anion; and M represents a metal (e.g., iron, nickel or cobalt).

Examples of the above-described aromatic group are, benzene, toluene, xylene, cumene, naphthalene, 1-methyl naphthalene, 2-methyl naphthalene, biphenyl and fluorene. Examples of $X^-$ are, $PF_6^-$, $BF_4^-$, $SbF_6^-$, $AlF_4^-$ and $CF_3SO_3^-$.

Preferred examples of the metal-arene complex are, iron-arene complex, chrome-arene complex, manganese-arene complex, cobalt-arene complex and nickel-arene complex. Among them, iron-arene complex is more preferred due to its high sensitivity.

Examples of iron-arene complex are listed in JP-A No. 59-219307. Specifically preferred are, η-benzene-(η-cyclopentadienyl)iron hexafluorophosphate, η-cumene-(η-cyclopentadienyl)iron hexafluorophosphate, η-fluorene-(ηcyclopentadienyl)iron hexafluorophosphate, η-naphthalene-(η-cyclopentadienyl)iron hexafluorophosphate, η-xylene-(η-cyclopentadienyl)iron hexafluorophosphate and η-benzene-(η-cyclopentadienyl)iron tetrafluoroborate An amount of iron-arene complex contained in the photosensitive layer is preferably 0.1 to 20 wt %, more preferably 0.5 to 10 wt % based on the total weight of the photosensitive layer.

Other photoinitiators which may be used together are, carbonyl compound, organic sulfur compound, peroxide, redox compound, azo compound, diazo compound, halide compound and photoreductive dye, which are listed in J. Kosar, "Light Sensitive Systems" Chapter 5. More specific compounds are disclosed in BP 1459563.

The followings may be used.

Benzoin derivatives, such as benzoin methyl ether, benzoin-i-propyl ether, α,α-dimethoxy-α-phenyl acetophenone; benzophenone, benzophenone derivatives, such as such as 2,4-dichloro benzophenone, methyl-o-benzoylbenzoate, 4,4'-bis (dimethylamino)benzophenone; thioxanthone derivatives such as 2-chlorothioxanthone, 2-i-propylthioxanthone; anthraquinone derivatives, such as 2-chloroanthraquinone and 2-methyl anthraquinone; acridone derivatives, such as N-methylacridones and N-butylacridone; α, α-diethoxyacetophenone, benzyl, fluorenone, xanthone, and uranyl; triazine derivatives described in Examined Japanese Patent Application Publication (JP-B) Nos. 59-1281 and 61-9621; JP-A No. 60-60104; organic peroxides described in JP-A Nos. 59-1504 and 61-243807; diazonium compounds described in JP-B Nos. 43-23648, 44-6413, 47-1604 and U.S. Pat. No. 3,567,453; organic azide compounds described in U.S. Pat. Nos. 2,848,328, 2,852,379, and U.S. Pat. No. 2,940,853; o-quinone diazides described in the JP-B Nos. 36-22062, 37-13109, 38-18015 and 45-9610; various onium compounds described in JP-B No. 55-39162, JP-A No. 59-14023 and "Macromolecules" volume 10, page 1307 (1977); azo compounds described in JP-A No. 59-142205; metal arene complexes described in JP-A No. 1-54440, European Patent Nos. 109,851 and 126,712, and J. Imag. Sci., volume 30 volume, in page 174(1986); (oxo)sulfonium organic boron complexes described in JP-A Nos. 5-213861 and No. 5-255347; titanocenes described in JP-A Nos. 59-152396 and 61-151197; transition metal complexes containing transition metals such as ruthenium described in "Coordination chemistry review" volume 84, pages 85-277 (1988), and JP-A No. 2-182701; 2, 4, 5-triarylimidazole dimer described in JP-A No. 3-209477; carbon tetrabromide; and halogenated organic compounds described in JP-A No. 59-107344.

Furthermore, the following are cited as an example of a polymerization initiator.

Compounds which can generate a radical described in JP-A 2002-No. 537419; polymerization initiators described in JP-A Nos. 2001-175006, 2002-278057, and JP-A No.2003-5363; oniums which have two or-more cation sections in the molecule described in JP-A No.2003-76010, N-nitrosamine compounds described in JP-A No. 2001-133966; compounds which generate a radical with heat described in JP-A No. 2001-343742, compounds which generate an acid or a radical with heat described in JP-A No. 2002-6482; borates described in JP-A No. 2002-116539; compounds which generate an acid or a radical with heat described in JP-A No. 2002-148790; light or thermal polymerization initiators which have an unsaturated group of the polymerizable described in JP-A No. 2002-207293; onium salts which have an anion of divalence or more as a counter ion described in JP-A No. 2002-268217; sulfonyl sulfone compounds having a specified structure described in JP-A No. 2002-328465; compounds which generate a radical with heat described in JP-A No. 2002-341519.

Especially preferable compounds are an onium compound and a poly halogenated compound.

The following are cited as an onium compound.

Diazonium salts described in S. I. Schlesinger, Photogr. Sci. Eng., 18, 387 (1974), T. S. Bal et al., Polymer, 21, 423 (1980); ammonium salts described in U.S. Pat. Nos. 4,069, 055, 4,069,056, 4,027,992; phosphonium salts described in D. C. Necker et al., Macromolecules, 17, 2468 (1984), C. S. Wen et al., The, Proc. Conf. Rad. Curing ASIA, p478, Tokyo, October (1988), U.S. Pat. Nos. 4,069,055 and 4,069, 056; iodonium salts described in J. V. Crivello et al., Macromorecules, 10 (6), 1307 (1977), Chem. & amp, Eng. News, Nov. 28, p31 (1988), E. P. No. 104,143, and U.S. Pat. Nos. 339,049, 410,201, JP-A Nos. 2-150848 and JP-A No. 2-296514; sulfonium salts described in J. V. Crivello et al., Polymer J. 17, 73(1985), J. V. Crivello et al., J. Org. Chem., 43, 3055(1978), W. R. Watt et al., J. Polymer Sci., Polymer Chem. Ed., 22, 1789(1984), J. V. Crivello et al., Polymer Bull., 14, 279(1985), J. V. Crivello et al., Macromorecules, 14(5), 1141(1981), J. V. Crivello et al., J. Polymer Sci., Polymer Chem. Ed., 17, 2877(1979), EP Nos. 370,693, 3,902,114, 233,567, 297,443, 297,442, U.S. Pat. Nos. 4,933, 377, 161,811, 410,201, 339,049, 4,760,013, 4,734,444, 2,833,827, DP Nos. 2,904,626, 3,604,580, 3,604,581; selenonium-salts described in J. V. Crivello et al., Macromorecules, 10 (6), 1307 (1977), J. V. Crivello et al., J. Polymer Sci., Polymer Chem. Ed., 17, 1047 (1979); arsonium salts described in C. S. A. Wen et al., The, Proc. Conf. Rad. Curing ASIA, p478 Tokyo, October (1988).

Among the above-cited oniums, iodonium salts and sulfonium salts are used especially preferably.

The following are cited as preferable examples of sulfonium salts.

Triphenylsulfonium tetrafluoroborate, methyldiphenyl sulfonium tetrafluoroborate, dimethylphenylsulfonium hexafluorophosphate, 4-butoxyphenyldiphenylsulfonium tetrafluoroborate, 4-chlorophenyldiphenylsulfonium hexafluorophosphate, tri(4-phenoxylphenyl)sulfonium hexafluorophosphate, di(4-ethoxyphenyl)methylsulfonium hexafluoroarsenate, 4-acetonyl phenyldiphenylsulfonium tetrafluoroborate, 4-thiomehoxyphenyl diphenylsulfonium hexafluorophosphate, di(methoxysulfonylphenyl)methylsulfonium hexafluoroantimonate, di(nitrophenyl)phenylsulfonium hexafluoroantimonate, di(carbomethoxyphenyl)methylsulfonium hexafluorophosphate, 4-acetamidophenyldiphenylsulfonium tetrafluoroborate, dimethylnaphthylsulfonium hexafluorophosphate, trifluoromethyldiphenylsulfonium tetrafluoroborate, p-(phenyl thiophenyl)diphenylsulfonium hexafluoroantimonate, 10-methyl phenoxathiinium hexafluorophosphate, 5-methylthianthrenium hexafluorophosphate, 10-phenyl-9,9-dimethylthioxanthenium hexafluorophosphate, and triphenylsulfonium tetrakis (pentafluorophenyl)borate.

The following are cited as preferable examples of iodonium salts.

Diphenyliodonium iodide, diphenyliodonium hexafluoroantimonate, 4-chlorophenyliodonium tetrafluoroborate, di(4-chlorophenyl)iodonium hexafluoroantimonate, diphenyliodonium hexafluorophosphate, diphenyliodonium trifluoroacetate, 4-trifluoromethylphenyl iodonium tetrafluoroborate, diphenyliodonium hexafluoroaresenate, ditolyliodonium hexafluorophosphate, di(4-methoxyphenyl) iodonium hexafluoroantimonate, di(4-methoxy phenyl)iodonium chloride, phenyl(4-methylphenyl) iodonium tetrafluoroborate, di (2,4-dimethyl phenyl) iodonium hexafluoroantimonate, di(4-t-butylphenyl)iodonium hexafluoroantimonate, 2,2'-diphenyliodonium hexafluorophosphate, and tolylcumyl diphenyliodonium tetrakis(pentafluorophenyl) borate.

A polyhalogenated compound is a compound containing a trihalogenomethyl group, dihalogenomethyl group or a dihalogenomethylene group in the molecule. Preferable examples are halogenated compounds represented by the following Formula (b) and oxadiazole compound substituted with the above-described halogenated groups.

$R^{21}$—$CY_2$—(C=O)—$R^{22}$  Formula (b)

wherein $R^{21}$ represents a hydrogen atom, a halogen atom, an alkyl group, an aryl group, an acyl group, an alkylsulfonyl group, an arylsulfonyl group, an iminosulfonyl group or a cyano group; $R^{22}$ represents a monovalent substituent, provided that $R^{21}$ and $R^{22}$ may combine with each other to form a ring; and Y represents a halogen atom.

$CY_3$—(C=O)—X—$R^{23}$  Formula (c)

wherein $R^{23}$ represents a monovalent substituent; X represents —O— or —$NR^{24}$—, in which $R^{24}$ represents a hydrogen atom or an alkyl group, provided that $R^{23}$ and $R^{24}$ may combine with each other to form a ring; and Y represents a halogen atom. Specifically, a compound containing a polyhalogenated acetyl amide group is preferably used.

Listed examples of compounds represented by Formula (b) are shown from BR1 to BR70. Another preferred examples are compounds having an oxadiazole ring substituted with a polyhalogenated methyl group. Listed examples are shown from H-1 to H-14. Further, oxadiazole compounds disclosed in JP-A Nos. 5-34904, 5-45875 and 8-240909 are also preferably used.

The compounds substituted a bromine atom with a chlorine atom may be preferably used in the present invention. Specific examples of polyhalogenated compounds are as follows.

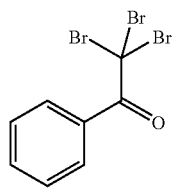

BR1

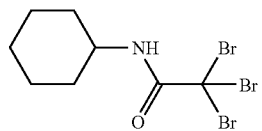

BR2

-continued
BR3 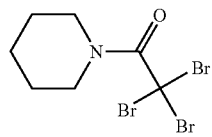
BR4 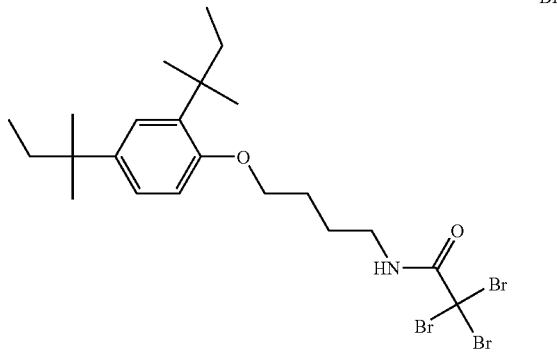
BR5 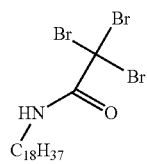
BR6 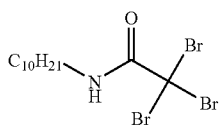
BR7 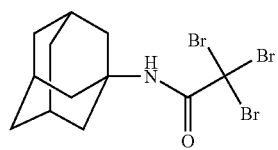
BR8 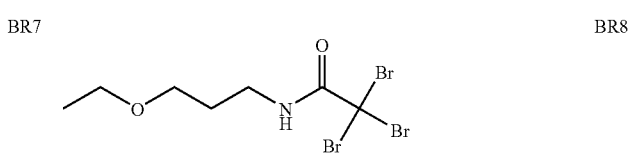
BR9 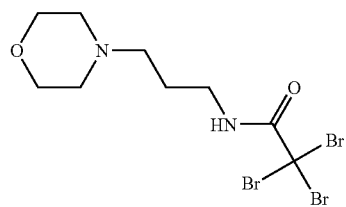
BR10 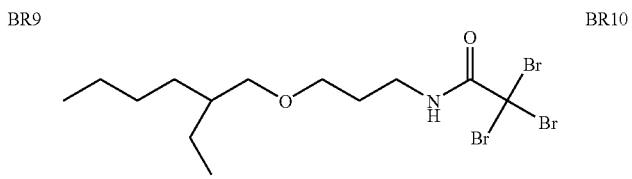
BR11 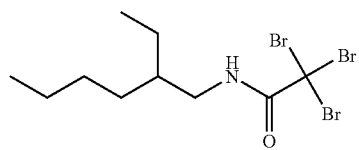
BR12 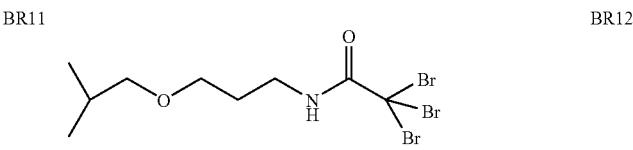
BR13 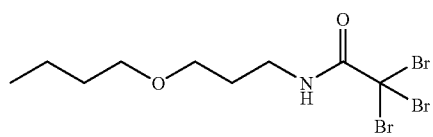
BR14 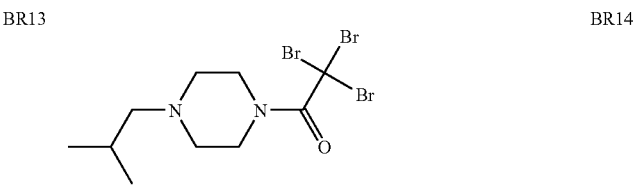
BR15 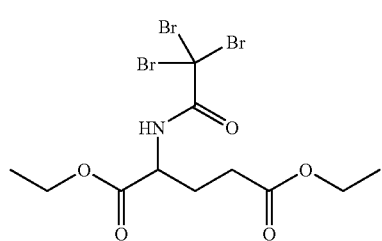
BR16

-continued
BR17 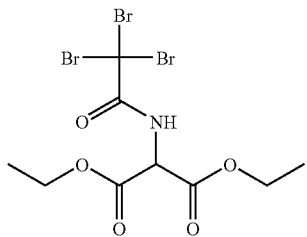 BR18 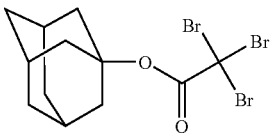
BR19 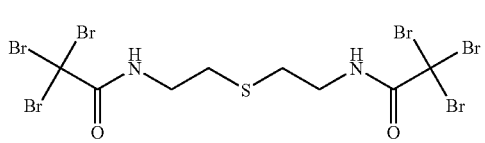 BR20 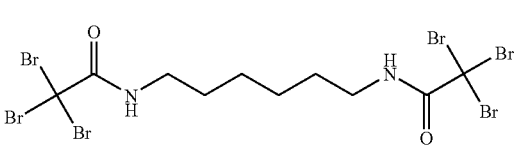
BR21 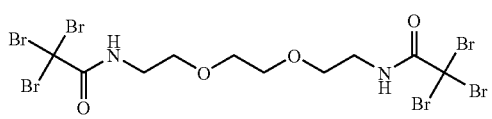 BR22 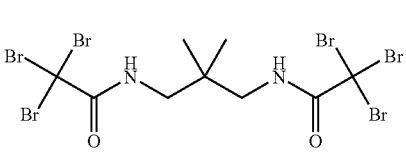
BR23 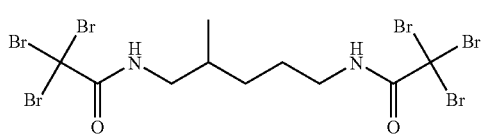 BR24 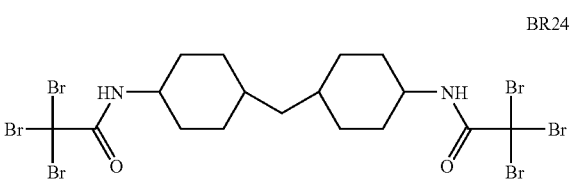
BR25 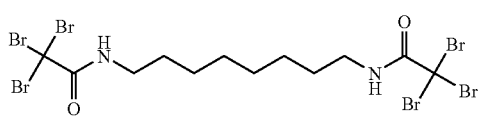 BR26 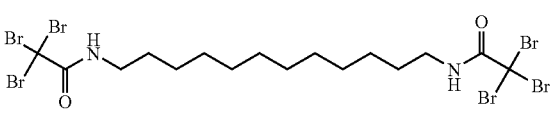
BR27 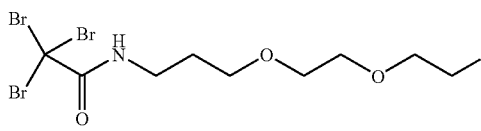 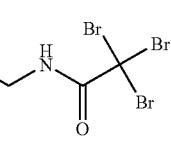
BR28 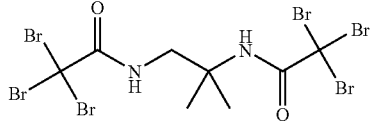 BR29 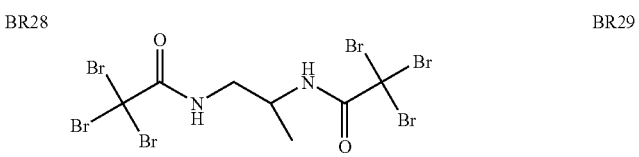
BR30 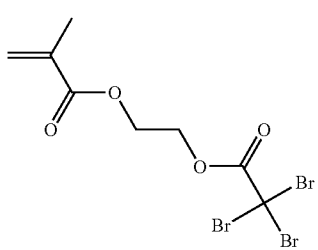 BR31 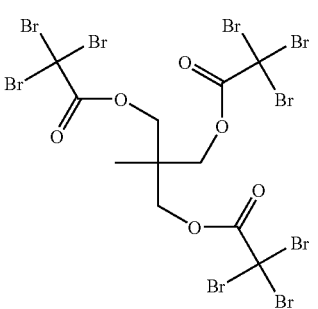

-continued
BR32
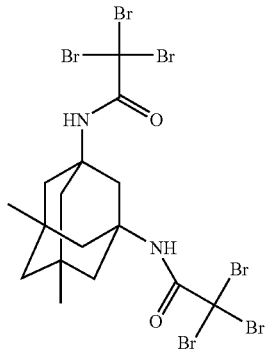
BR33
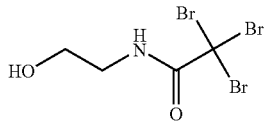
BR34
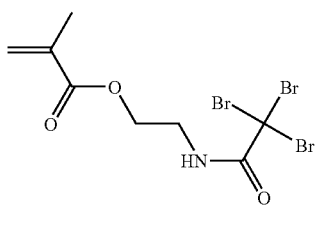
BR35
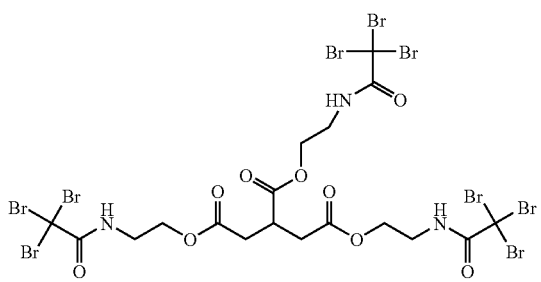
BR36
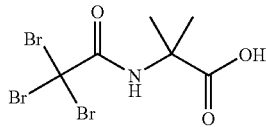
BR37
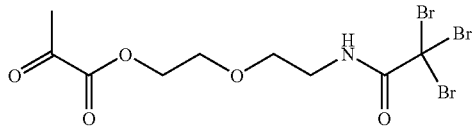
BR38
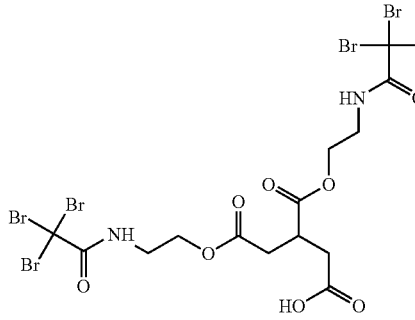
BR39
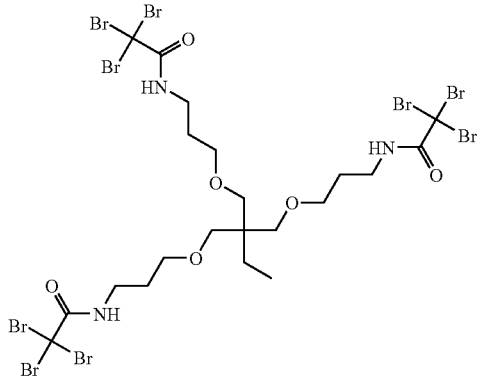
BR40
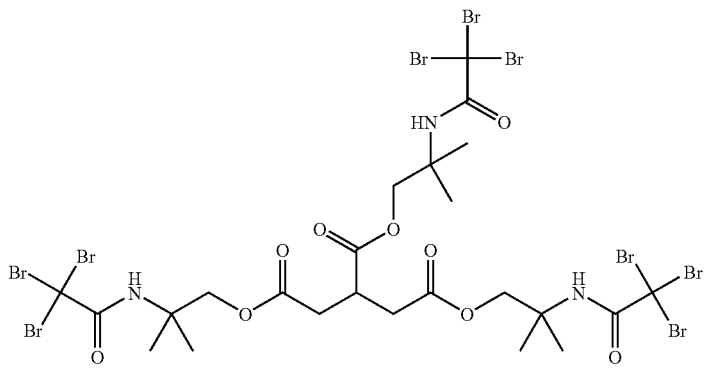

-continued
BR41 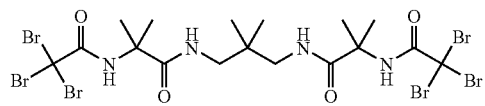 BR42 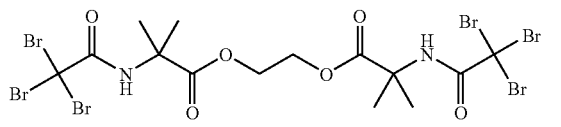
BR43 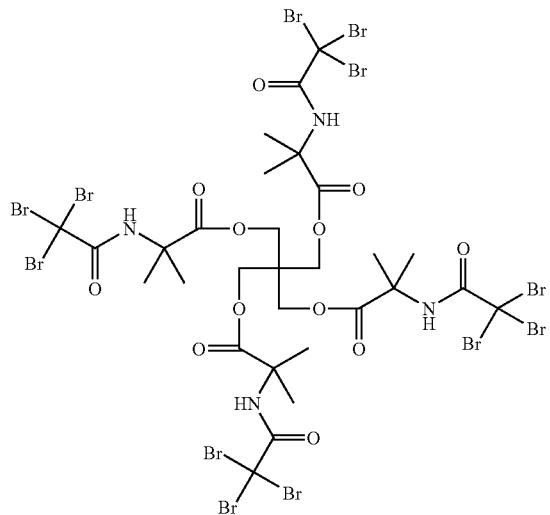
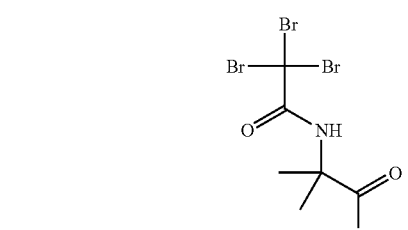
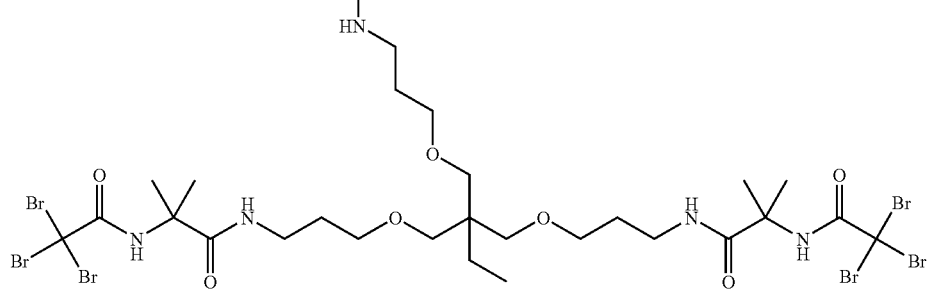
BR45 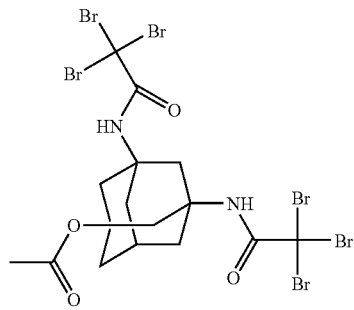 BR46 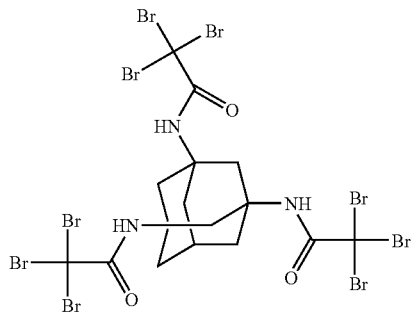
BR47 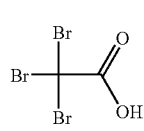 BR48 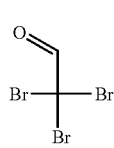

-continued
BR49 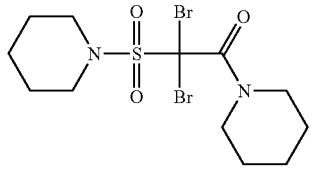 BR50 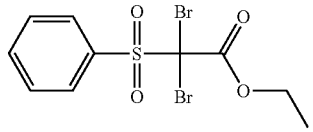
BR51 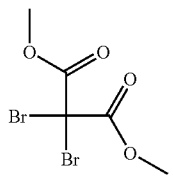 BR52 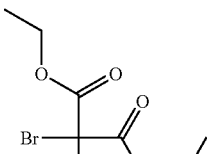
BR53 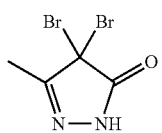 BR54 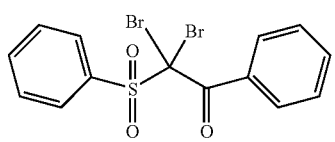
BR55 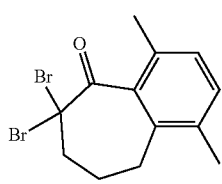 BR56 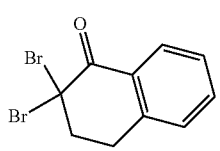
BR57 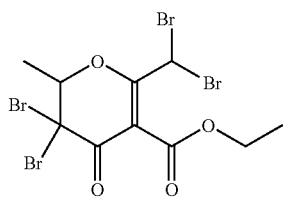 BR58 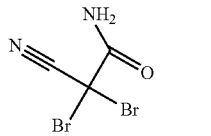
BR59 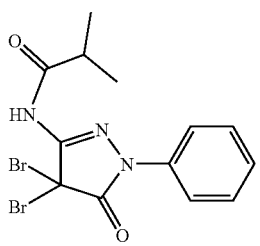 BR60 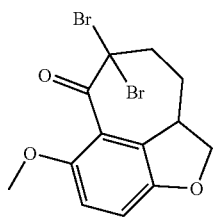
BR61 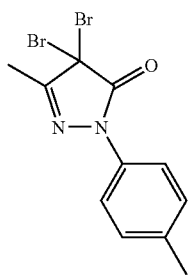 BR62 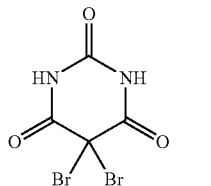
BR63 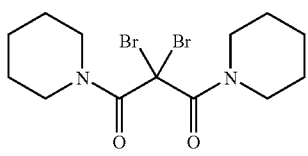 BR64 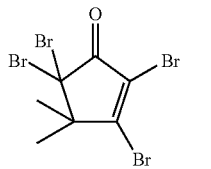

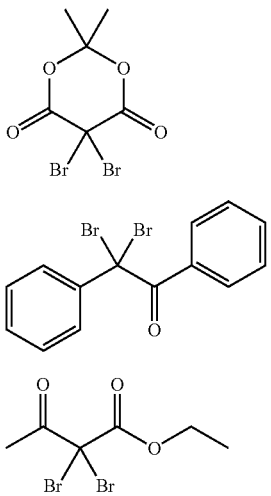

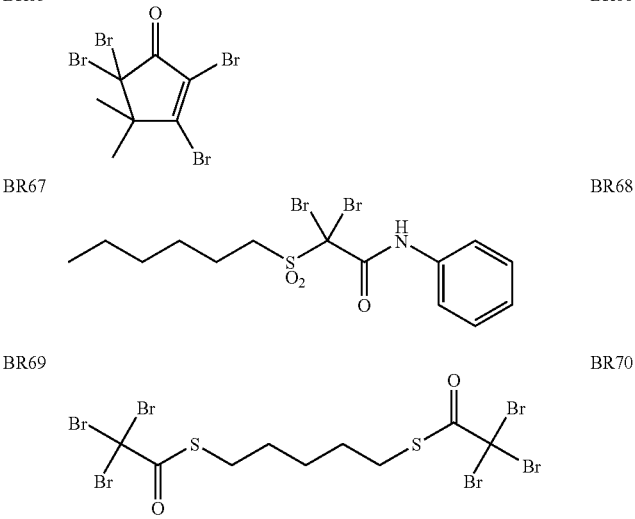

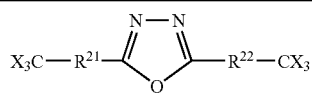

| No. | $R^{21}$ | $R^{22}$ | X |
|---|---|---|---|
| H-1 | Single bond | Single bond | Cl |
| H-2 | Single bond | Single bond | Br |
| H-3 | $CH_2$ | $CH_2$ | Cl |
| H-4 | $CH_2$ | $CH_2$ | Br |
| H-5 | $OCH_2$ | $OCH_2$ | Cl |
| H-6 | $OCH_2$ | $OCH_2$ | Br |
| H-7 | O | O | Cl |
| H-8 | O | O | Br |
| H-9 | OCO | COO | Cl |
| H-10 | $CH_2$—COO | COO—$CH_2$ | Br |
| H-11 | NH—CO | CO—NH | Cl |
| H-12 | NH—CO | CO—NH | Br |
| H-13 | $SO_2$—NH | NH—$SO_2$ | Cl |
| H-14 | $SO_2$—NH | NH—$SO_2$ | Br |

The content of the polymerization initiator in the light sensitive layer is not specifically limited, but is preferably from 0.1 to 20% by weight, and more preferably from 0.8 to 15% by weight.

(Anionic Dye Dissolving in Methyl Ethyl Ketone in an Amount of Not Less Than 1%)

An anionic dye of the present invention dissolving in an amount of not less than 1% indicates an anionic dye dissolving in methyl ethyl ketone not less than 1 wt % at 25° C. More preferably, an anionic dye dissolving in methyl ethyl ketone in an amount of not less than 1.5 wt %. And still more preferably, it is not less than 2 wt %, and specifically preferably, it is not less than 2.5 wt %.

The above-described dye can be obtained by allowing to react, (1) an anionic dye having an acid group, a basic group or a hydroxyl group; and (2) a compound having a group capable of reaction an acid group, a basic group or a hydroxyl group and having an SP value of from 15 to 26 [$Mpa^{1/2}$].

A solubility parameter (an SP value) is a value used for evaluating a solubilizing capability of a nonelectrolite into an organic solvent. This value can be obtained by a method made by Hilderbrand. This solubility parameter can be referred to, J. H. Hildebrand and J. M. Prausnitz, R. L. Scott, "Regular and Related Solutions", Van Nostrand-Reinhold, Princeton (1970), and "Polymer data handbook, Basic edition", Society of Japanese Polymer Science.

The solubility values of various solvents are disclosed in, A. F. M. Barton, "Handbook of Solubility Parameters and Other Cohesion Parameters", CRC Press, BocaRaton/Florida (1983) and "Polymer data handbook, Basic edition", Society of Japanese Polymer Science.

Examples of compounds of (2) include, 1-propanol, 2-propanol, butanol, isobutanol, cyclohexanol, pentanol, 2-ethyl-1-butanol, 1,3-dimethyl-1-butanol, 1-octanol, 2-octanol, decanol, undecanol, dodecanol, tridecyl alcohol, oleyl alcohol, allyl alcohol, 3-chloropropanol, benzyl alcohol, and diacetone alcohol.

Among them, preferred are alcohols having an SP value of from 20 to 26 [$Mpa^{1/2}$]. Examples are, 1-propanol, 2-propanol, butanol, isobutanol, cyclohexanol, pentanol, 2-ethyl-1-butanol, 1-octanol, 2-octanol, decanol, undecanol, allyl alcohol, 3-chloropropanol, benzyl alcohol, and diacetone alcohol.

In the present invention, an anionic dye represented by the above-described Formula (1) is preferred.

In Formula (1), $R_1$ represents a substituted or unsubstituted alkyl group having a carbon atom number of 1 to 18 or aryl group such as an ethyl, butyl, hexyl, octyl, decyl, dodecyl, lauryl phenyl and cyclohexyl group.

Preferably, $R_1$ is a substituted or unsubstituted alkyl group having a carbon atom number of 4 to 10 or a substituted or unsubstituted aryl group. More preferably, it is a substituted or unsubstituted alkyl group having a carbon atom number of 4 to 10.

As the above-described substituents, monovalent nonmetallic atomic groups are used, and the followings are cited as preferable examples.

Halogen atom (-F, -Br, -Cl, -I), hydroxyl group, alkoxy group, aryloxy group, mercapto group, alkylthio group, aryl thio group, alkyldithio, aryldithio, amino group, N-alkylamino group, N, N-dialkylamino group, N-arylamino group, N, N-diarylamino group, N-alkyl-N-arylamino group, acyloxy group, carbamoyloxy group, N-alkylcarbamoyloxy group, N-aryl carbamoyloxy group, N, N-dialkylcarbamoyloxy group, N, N-diarylcarbamoyloxy group, N-alkyl-N-aryl carbamoyloxy group, alkylsulfoxy group, arylsulfoxy group, acylthio group, acylamino group, N-alkylacylamino group, N-arylacylamino group, ureide group, N'-alkylureide group, N',N'-dialkylureide group, N'-arylureide group, N',N'-diarylureide group, an N'-alkyl-N'-arylureide group, N-alkylureide group, N-arylureide group, N'-alkyl-N-alkylureide group, N'-alkyl-N-arylureide group, N',N'-dialkyl-N-alkylureide group, N', N'-dialkyl-N-arylureide group, N'-aryl-N-alkylureide group, N'-aryl-N-arylureide group, N',N'-diaryl-N-alkylureide group, N',N'-diaryl-N-arylureide group, N'-Alkyl-N'-aryl-N-alkylureide group, N'-alkyl-N'-aryl-N-arylureide group, alkoxycarbonylamino group, aryloxycarbonylamino group, N-alkyl-N-alkoxycarbonylamino group, N-alkyl-N-aryloxycarbonyl amino group, N-aryl-N-alkoxycarbonylamino group, N-aryl-N-aryloxycarbonylamino group, formyl group, acyl group, carboxyl group and its conjugate base group (it is called as carboxylate hereafter), alkoxycarbonyl group, aryloxy carbonyl group, carbamoyl group, N-alkylcarbamoyl group, N, N-dialkylcarbamoyl group, N-arylcarbamoyl group, N, N-diaryl carbamoyl group, N-alkyl-N-arylcarbamoyl group, alkylsulfinyl group, arylsulfinyl group, alkylsulfonyl group, arylsulfonyl group, sulfo group (-SO$_3$H) and its conjugate base group (it is called as sulfonate group hereafter), alkoxysulfonyl group, aryloxysulfonyl group, sulfinamoyl group, N-sulfinamoyl group, N, N-dialkylsulfinamoyl group, N-aryl sulfinamoyl group, N, N-diarylsulfinamoyl group, N-alkyl-N-arylsulfinamoyl group, sulfamoyl group, N-alkylsulfamoyl group, N, N-dialkylsulfamoyl group, N-arylsulfamoyl group, N, N-diarylsulfamoyl group, N-alkyl-N-arylsulfamoyl group, N-acylsulfamoyl group and its conjugate base group, N-alkylsulfonylsulfamoyl group (-SO$_2$NHSO$_2$(alkyl)) and its conjugate base group, N-arylsulfonylsulfamoyl group (-SO$_2$NHSO$_2$(aryl)) and its conjugate base group, N-alkylsulfonylcarbamoyl group (-CONHSO$_2$(alkyl)) and its conjugate base group, N-arylsulfonylcarbamoyl group (-CONHSO$_2$(aryl)) and its conjugate base group, alkoxysilyl group (-Si (O-alkyl)$_3$), aryloxysilyl group (-Si (O-aryl)$_3$), hydroxysilyl group (-Si(OH)$_3$) and its conjugate base group, phosphono group (-PO$_3$H$_2$) and its conjugate base group (it is called as phosphonate group hereafter), dialkylphosphono group (-PO$_3$(alkyl)$_2$), a diarylphosphono group (-PO$_3$(aryl)$_2$), alkylarylphosphono group (-PO$_3$(alkyl)(aryl)), monoalkylphosphono group (-PO$_3$H(alkyl)) and its conjugate base group (it is called as alkylphosphonate group hereafter), monoarylphosphono group (-PO$_3$H(aryl)) and its conjugate base group (it is called as arylphosphonate group hereafter), phosphonooxi group (-OPO$_3$H$_2$) and its conjugate base group (it is called as phophonate oxi-group hereafter), dialkylphosphonooxi group (-OPO$_3$(alkyl)$_2$), diarylphosphono oxi group (-OPO$_3$(aryl)$_2$), alkylarylphosphono oxi-group (-OPO$_3$ (alkyl)(aryl)), monoalkylphosphonooxi group (-OPO$_3$H(alkyl)) and its conjugate base group (it is called as alkyl phosphonate oxi group herafter), monoarylphosphonooxi group (-OPO$_3$H(aryl)) and its conjugate base group (it is called as alkyl as arylphosphonate oxi-group hereafter), cyano group, nitro group, aryl group, alkenyl group, alkynyl group.

$R_2$ to $R_{11}$ each represents a hydrogen atom, F, Cl, I, Br, a substituted or unsubstituted alkyl group having a carbon atom number of 1 to 6, a substituted or unsubstituted aryl group or -N($R_{12}$)($R_{13}$), provided that $R_{12}$ and $R_{12}$ each independently represents a substituted-or unsubstituted alkyl group having a carbon atom number of 1 to 6, or a substituted or unsubstituted aryl group.

Among them, preferred are Br, dimethylamino group, and diethylamino group.

X represents a hydrogen atom, a monovalent alkali metal or an onium salt.

Examples of the anionic dyes of the present invention are shown below, however, the present invention is not limited thereby.

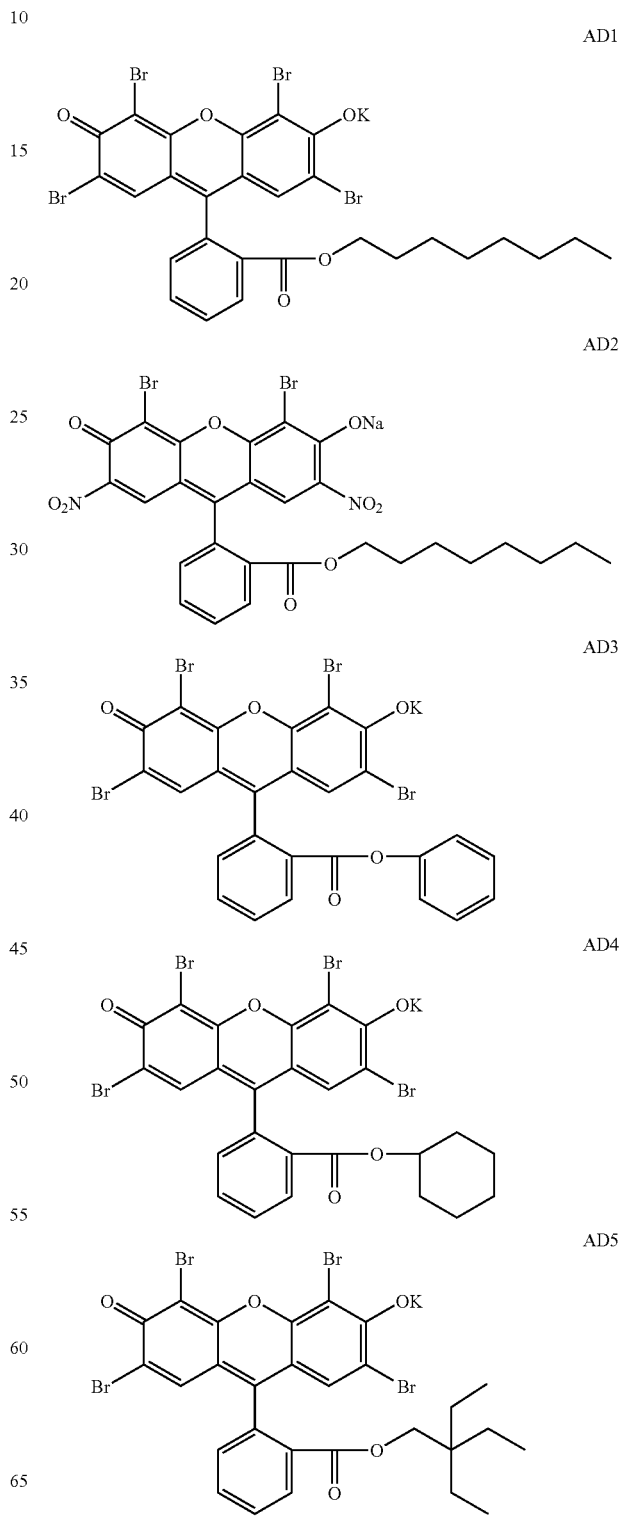

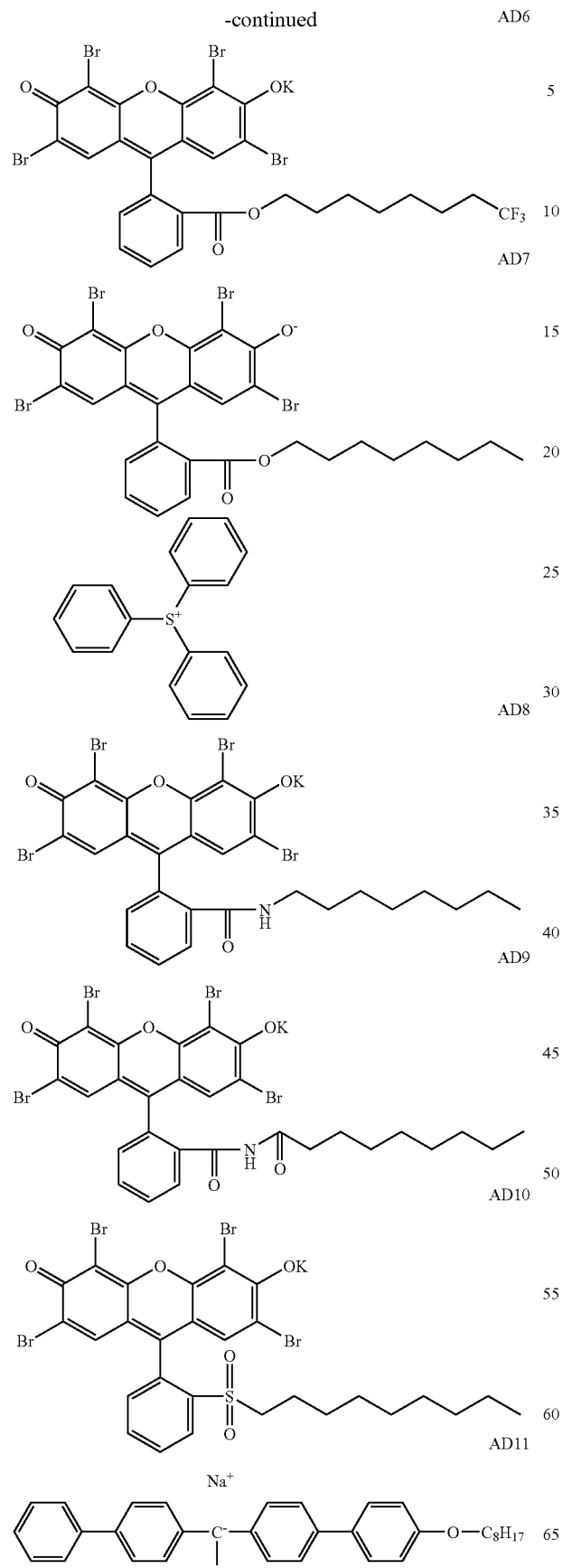
An amount of the anionic dye of the present invention in the photosensitive layer is preferably from 0.1 to 20 wt %, and more preferably from 0.5 to 10 wt % based on the total weight of the photosensitive layer.

A molar ratio of a photopolymerization initiator to a anionic dye is preferably between 5:1 and 0.01:1. When a polyhalogenated compound is contained, a molar ratio of a polyhalogenated compound to an anionic dye is preferably between 1.5:1 and 0.01:1, and more preferably, between 1.5:1 and 0.1:1.

(B) Polymer Binder

A polymer binder used in the present invention is capable of holding elements in the photosensitive layer of the planographic printing material.

Listed examples of the polymer binders are, an acrylic polymer, polyvinyl butyral resin, polyurethane resin, polyamide resin, polyester resin, epoxy resin, phenol resin, polycarbonate, polyvinyl butyral resin, polyvinyl formal resin, shellac and other known natural resin. The combination of two or more may be used.

Among them, particularly preferred for the present invention is an alkali soluble polymer.

In the invention, the alkali soluble polymer refers to a polymer having an acid value and is preferably a copolymer having various structures described later.

As the copolymer, a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin is preferably used. These resins can be used as an admixture of two or more thereof.

Of these, polymers having a hydroxyl group or a carboxyl group are preferably used, and polymers having a carboxyl group are more preferably used.

Of these, a vinyl copolymer is preferably used which is obtained by copolymerization of an acryl monomer, and more preferred is a copolymer containing (a) a carboxyl group-containing monomer unit and (b) an alkyl (meth) acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate and alkyl acrylate include an unsubstituted alkyl ester such as: methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, or dodecyl methacrylate; and methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, or dodecyl methacrylate, a cyclic alkyl ester such as: cyclohexyl methacrylate or cyclohexyl acrylate, and a substituted alkyl ester such as: benzyl methacrylate, 2-chloroethyl methacrylate, N, N-dimethylaminoethyl methacrylate, or glycidyl methacrylate, benzyl acrylate, 2-chloroethyl acrylate, N, N-dimethylaminoethyl acrylate, or glycidyl methacrylate.

As another monomer unit, a monomer unit derived from the monomer described in the following items (1) through (14) can be used.

(1) A monomer having an aromatic hydroxy group, for example, o-, (p- or m-)hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl-ether, butyl vinyl ether, octyl vinyl ether, or phenyl vinyl ether;

(8) A vinyl ester, for example, vinyl acetate, vinyl chloroacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N, N-diethylaminoethyl methacrylate, N, N-dimethylaminoethyl acrylate, N, N-dimethylaminoethyl methacrylate, polybutadiene urethane acrylate, N, N-dimethylaminopropyl acrylamide, N, N-dimethylacrylamide, acryloylmorpholine, N-isopropylacrylamide, or N, N-diethylacrylamide.

Further another monomer may be copolymerized with the above monomers.

Another preferred polymer is an unsaturated bond-containing vinyl copolymer which is obtained by reacting a carboxyl group contained in the above vinyl copolymer with for example, a compound having a (meth)acryloyl group and an epoxy group.

Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

Of the above alkali soluble polymers, those giving an acid value of from 30 to 200 are preferred. Of these, those further having a weight average molecular weight of from 15,000 to 500,000 are especially preferred.

Of the above polymers, those having a polymerizable unsaturated group are preferred, and those having 5 to 50% of the polymerizable unsaturated group as a repeating unit are especially preferred.

In the invention, the weight average molecular weight of the polymers is measured by gel permeation chromatography (GPC).

In the invention, the acid value refers to the number of mg of potassium hydroxide (KOH) necessary to neutralize 1 g of the compound described above. The acid value can be determined as follows: A sample is diluted with methyl cellosolve by a factor of 50, and the resulting solution is titrated with a 0.1 mol/liter potassium hydroxide solution. Inflection point of the pH curve obtained according to a pH meter is a neutralizing point, and the acid value is obtained from an amount of potassium hydroxide necessary to reach the neutralizing point.

An alkali soluble polymer having a polymerizable unsaturated group can be synthesized according to a conventional method without any limitations.

For example, a method can be used which reacts the carboxyl group described later with a glycidyl group, or reacts a hydroxyl group with an isocyanate group.

Typically, the alkali soluble polymer is a reaction product obtained by reacting a copolymer having a carboxyl group-containing monomer unit with an aliphatic epoxy-containing unsaturated compound such as allyl glycidyl ether, glycidyl (meth)acrylate, α-ethylglycidyl (meth)acrylate, glycidyl crotonate, glycidyl isocrotonate, crotonyl glycidyl ether, itaconic acid monoalkylmonoglycidyl ester, fumaric acid monoalkylmonoglycidyl ester, or maleic acid monoalkylmonoglycidyl ester; or an alicyclic epoxy-containing unsaturated compound such as 3,4-epoxycyclohexylmethyl (meth)acrylate. In the invention, when an amount of the carboxyl group reacted with the epoxy-containing unsaturated compound is represented in terms of mol %, The amount is preferably from 5 to 50 mol %, and more preferably from 10 to 30 mol % in view of sensitivity and printing durability.

Reaction of a copolymer having a carboxyl group-containing monomer unit with an epoxy-containing unsaturated compound is carried out for example, at 80 to 120° C. for 1 to 50 hours. The reaction product can be synthesized according to a conventional polymerization method, for example, a method described in literatures such as W. R. Sorenson & T. W. Cambell "Kobunshi Gosei Jikkenho" published by TOKYO KAGAKU DOHJIN, or Japanese Patent O.P.I. Publication Nos. 10-315598 and 11-271963, or a method similar to the above.

The content of the alkali soluble polymer in the light sensitive layer is preferably from 10 to 90% by weight, more preferably from 15 to 70% by weight, and still more preferably from 20 to 50% by weight.

Examples of the copolymer having a carboxyl group-containing monomer unit described above include a copolymer having at least one selected from units derived from the following monomers (1) through (17):
(1) A monomer having an aromatic hydroxy group;
(2) A monomer having an aliphatic hydroxy group;
(3) A monomer having an aminosulfonyl group;
(4) A monomer having a sulfonamide group;
(5) An α,β-unsaturated carboxylic acid;
(6) A substituted or unsubstituted alkyl acrylate;
(7) A substituted or unsubstituted alkyl acrylate;
(8) Acrylamide or methacrylamide;
(9) A monomer having a fluorinated alkyl group;
(10) A vinyl ether;
(11) A vinyl ester;
(12) A styrene;
(13) A vinyl ketone;
(14) An olefin;
(15) N-vinylpyrrolidone, N-vinylcarbazole, or N-vinylpyridine;
(16) A monomer having a cyano group; and
(17) A monomer having an amino group.

Typical examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

(C) Ethylenically Unsaturated Compound

The ethylenically unsaturated compound in the invention is a compound having a ethylenically unsaturated group in the compound and is capable of polymerizing.

Suitably used examples for the present invention are, generally known radical polymerization monomers, polyfunctional monomers having an ethylenic double bond capable of addition polymerization used for common UV curing resins, or poly-functional oligomers.

The ethylenically unsaturated compounds are not specifically limited, however, preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

Further, a prepolymer can also be used as the above-described monomers. The prepolymer may be used solely or may be used in combination of two or more, and the prepolymer may be sued in combination of the above-described monomers or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A·epichlorhydrin·(meth)acrylic acid or phenol novolak·epichlorhydrin·(meth)acrylic acid obtained by incorporating (meth)acrylic acid in an epoxy resin; an urethaneacrylate such as ethylene glycol·adipic acid·tolylenediisocyanate·2-hydroxyethylacrylate, polyethylene glycol·tolylenediisocyanate·2-hydroxyethylacrylate, hydroxyethylphthalyl methacrylate·xylenediisocyanate, 1,2-polybutadieneglycol ·tolylenediisocyanate·2-hydroxyethylacrylate or trimethylolpropane·propylene glycol·tolylenediisocyanate·2-hydroxyethylacrylate, obtained by incorporating (meth)acrylic acid in an urethane resin; a silicone acrylate such as polysiloxane acrylate, or polysiloxane.diisocyanate·2-hydroxyethylacrylate; an alkyd modified acrylate obtained by incorporating a methacroyl group in an oil modified alkyd resin; and a spiran resin acrylate.

The light sensitive composition or light sensitive layer of the planographic printing plate material of the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenically unsaturated compound used in the invention is a phosphate compound having at least one (meth)acryloyl group. The phosphate compound is a compound having a (meth)acryloyl group in which at least one hydroxyl group of phosphoric acid is esterified. The ethylenically unsaturated compound used in the invention is not limited, as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV·EB Koka Handbook (Materials)" edited by Kobunshi Kankokai can be suitably used. Of these compounds, compounds having two or more acryl or methacryl groups in the molecule are preferable, and those having a molecular weight of not more than 10,000, and those having a molecular weight of not more than 5,000 are more preferable.

In the present invention, it is preferable to use a polymerizable compound having an ethylenically unsaturated bond and containing a tertiary amino group in the molecule. The structure of the preferred compound is not specifically limited, however, preferred compounds are tertiary amino compounds having a hydroxyl group modified with glycidyl methacrylate, methacryloyl chloride or acryloyl chloride. More specifically, the compounds disclosed in JP-A Nos. 1-165613, 1-203413 and 1-197213 may be preferably used.

Further, in the present invention, it is preferably used such as a polyalcohol having a tertiary amino group in the molecule, a diisocyanate compound, a reaction product of a polymerizable compound having an ethylenically unsaturated bond and a hydroxyl group in the molecule. Specifically preferable compound is a compound having a tertiary amino group and an amido bond.

As polyalcohols containing a tertiary amino group in the molecule, the followings are cited.

Triethanolamine, N-methyldiethanolamine, N-ethyl diethanolamine, N-n-butyl diethanolamine, N-tert-butyl diethanolamine, N, N-di(hydroxyethyl)aniline, N, N, N', N'-tetra-2-hydroxypropylethylenediamine, p-tolyl diethanolamine, and N, N, N', N'-tetra-2-hydroxyethyl ethylenediamine, N, N-bis(2-hydroxypropyl)aniline, aryl diethanolamine, 3-(dimethylamino)-1,2-propanediol, 3-diethyl amino-1,2-propanediol, N, N-di(n-propyl)amino-2,3-propanediol, N, N-di(iso-propyl)amino-2,3-propanediol, and 3-(N-methyl-N-benzylamino)-1,2-propanediol.

The present invention is not limited to these.

The following are cited as diisocyanate compounds.

Butane-1,4-diisocyanate, hexane-1,6-diisocyanate, 2-methylpentane-1,5-diisocyanate, octane-1,8-diisocyanate, 1,3-diisocyanatemethyl-ketohexamethylene, 2 and 2,4-trimethyl hexane-1,6-diisocyanate, isophoronediisocyanate, 1,2-phenylenediisocyanate, 1,3-phenylenediisocyanate, 1,4-phenylenediisocyanate, tolylene-2,4-diisocyanate, tolylene-2,5-diisocyanate, tolylene-2,6-diisocyanate, 1,3-di (isocyanatomethyl)benzene, and 1,3-bis(1-isocyanato-1-methyl ethyl)benzene.

The present invention is not limited to these.

Although MH-1 to MH-13 are cited as compounds having a hydroxyl group and an ethylenic double bond capable of addition polymerization in the molecule, it is not limited to these.

Preferably cited are, 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

These reactions are reactions between a diol compound, a diisocyanate compound, and an acrylate compound containing a hydroxyl group, and can be performed like the way of preparing an urethane acrylate.

Examples of reaction products between polyalcohol containing a tertiary amino group in the molecule, a diisocyanate compound, and a compound containing the ethylene nature double bond and a hydroxyl group capable of polymerization are shown below.

M-1: The reaction product of triethanolamine (one mol), hexane-1,6-diisocyanate (three mols), and 2-hydroxyethyl methacrylate (three mols)

M-2: The reaction product of triethanolamine (one mol), isophorone diisocyanate (three mols), and 2-hydroxyethyl acrylate (three mols)

M-3: The reaction product of N-n-butyldiethanolamine (one mol), 1,3-bis (1-isocyanato-1-methylethyl)benzene (two mols), and 2-hydroxy propylene-1-methacrylate-3-acrylate (two mols)

M-4: The reaction product of N-n-butyldiethanolamine (one mol), 1,3-di(isocyanatomethyl)benzene (two mols), and 2-hydroxypropylene-1-methacrylate-3-acrylate (two mols)

M-5: The reaction product of N-methyldiethanolamine (one mol), tolylene-2,4-diisocyanate (two mols) and 2-hydroxy propylene-1, and 3-dimethacrylate (two mols)

M-6: The reaction products of triethanolamine (one mol), 1,3-bis(1-isocyanato-1-methylethyl)benzene (three mols) and 2-hydroxyethyl methacrylate (three mols)

M-7: The reaction product of ethylenediaminetetraethanol (one mol), 1,3-bis(1-isocyanato-1-methylethyl)benzene (four mols) and 2-hydroxyethyl methacrylate (four mols)

In addition, acrylate or alkyl acrylate described in JP-A Nos. 1-105238 and 2-127404 can use.

An amount of the compound which contains an unsaturated group and can be polymerized in the photosensitive layer is, preferably 5 to 80 weight %, and more preferably 15 to 60 weight % based on the total weight of the photosensitive layer.

Support

A support of the present invention is a plate or a film which is capable of holding an photosensitive layer, and is preferably has a hydrophilic surface on which the photosensitive layer is provided.

As the supports used in the invention, a plate of a metal such as aluminum, stainless steel, chromium or nickel, or a plastic film such as a polyester film, a polyethylene film or a polypropylene film, which is deposited or laminated with the above-described metal can be used.

Further, a polyester film, a polyvinyl chloride film or a nylon film whose surface is subjected to a treatment to provide hydrophilic nature can be used. Among the above, the aluminum plate is preferably used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron. The aluminum support is used after being treated surface roughening so as to give a water holding capacity.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

The mechanical surface roughening methods used for the present invention are not specifically limited, however, brush roughening and horning roughening are preferred.

The electrochemical surface roughening methods used for the present invention are also not specifically limited, however, it is preferable to carry out the electrochemical surface roughening in an acidic electrolytic solution.

After carrying out the surface roughening treatment with an electrochemical surface roughening method, it is preferable to immerse the support in an acidic or basic solution so as to eliminate waste aluminum materials remained on the surface of the support. Listed examples of acids are, sulfuric acid, persulphuric acid, hydrofluoric acid, phosphoric acid, nitric acid and hydrochloric acid. Listed examples of bases are, sodium hydroxide and potassium hydroxide. Among them, an alkali aqueous solution is preferred. An amount of aluminum to be dissolved is preferably, from 0.5 to 5 $g/m^2$. After the immersion treatment in an alkali solution, it is preferable to neutralize the alkali with an acid such as phosphoric acid, nitric acid, sulfuric acid, chromic acid or the mixed acid thereof.

The mechanical surface roughening methods and the electrochemical surface roughening methods may be employed solely or it may be combined: at first, carry out a mechanical surface roughening method; and then carry out a electrochemical surface roughening method.

After surface roughening treatment, it may be applied anode oxidation treatment. The anode oxidation methods used for the present invention are not specifically limited. Usually known anode oxidation methods may be employed. By carrying out the anode oxidation treatment, an oxidized coating is formed on the support.

The support having been subjected to anode oxidation treatment may be further subjected to sealing treatment when required. The sealing treatment may be carried out using the methods such as hot water treatment, boiling water treatment, vapor treatment, sodium silicate treatment, bichromate salt aqueous solution treatment, nitrite salt treatment and ammonium acetate treatment.

Further, after above-described treatments, it is preferably carry out under coat treatment with a water soluble resin (e.g., a polymer or a copolymer having a polyvinylphosphinic acid group or a sulphonic acid group in the side chain), polyacrylic acid, a water soluble metallic salt (e.g., zinc borata), a yellow dye or a amine salt. Still further, sol-gel treatment described in JP-A No. 5-304358, which forms a covalent bond between a functional group and a radical by an addition reaction, is also preferably used.

In the invention, a planographic printing plate material can be obtained by preparing a light sensitive composition, coating the liquid on the support according to a coating conventional method, and drying. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

The drying temperature of the coated light sensitive layer is preferably from 60 to 160° C., more preferably from 80 to 140° C., and still more preferably from 90 to 120° C.

In the invention, a protective layer (an oxygen shielding layer) is preferably provided on the light sensitive layer. It is preferred that the protective layer is highly soluble in the developer as described later (generally an alkaline solution).

Listed examples of the compounds included in the protective layer are, polyvinyl alcohol, polysaccharide, polyvinylpyrrolidone, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide and polyvinylpyrrolidone copolymer. These compounds may be used in the protective layer forming composition solely or in combination of two or more.

In order to prepare the coating composition of the protective layer, the above-listed compound is dissolved in an appropriate solvent, and then used for coating. The protective layer is coated on the photopolymerizable light sensitive layer and drying. The thickness of the protective layer is preferably 0.1 to 5.0 μm, and more preferably 0.5 to 3.0 μm. The protective layer may further contain a surfactant or a matting agent.

The coating methods for the protective layer may be suitably applied the methods listed for the above-described photosensitive layer. The drying temperature of the coated protective layer is preferably lower than that of the photosensitive layer. It is preferably 10° C. lower or more than the drying temperature of the photosensitive layer, more preferably, it is 20° C. lower or more and the upper limit is about 50° C.

The drying temperature of the coated protective layer is preferably lower than a glass transition temperature (Tg) of the binder included in the photosensitive layer. The difference between the drying temperature of the protective layer and a glass transition temperature (Tg) of the binder included in the photosensitive layer is preferably not less than 20° C., and more preferably not less than 40° C., and upper limit is about 60° C.

Preparation Method of a Print Plate

It is preferable to use a laser having a wavelength of 400-600 nm as a light source for exposing the planographic printing material. Listed examples of lasers are, He-Cd laser (441 nm); a combination of solid laser Cr:LiSAF and SHG crystal (430 nm); diode laser KnbO$_3$; ring resonator (430 nm); AlGaInN (350-450 nm); InGAN (400-410 nm); argon laser (488 nm); W-YAG laser and SHG (532 nm). Specifically, W-YAG laser and SHG(532 nm) is preferred for the planographic printing material of the present invention.

As a laser scanning method by means of a laser beam, there are a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam.

In the method of scanning oh an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum.

In the method of scanning on a plane, main scanning by means of a laser beam is carried out through a combination of a polygon mirror, a galvanometer mirror and an Fθ lens, and sub-scanning is carried out by moving a recording medium.

The method of scanning on an outer surface of a cylinder is suitable for high density image recording, since it is easily construct an optical system and it is possible to decrease the distance between a light source and the recording material.

In the present invention, it is preferable to heat the exposed planographic printing material prior to development or during the development. This heating treatment (pre-heating) enable to achieve an improved sensitivity and improved printing durability.

When pre-heating is applied to the planographic printing material in an auto-processor to develop the material, a pre-heat roller may be used to heat the material at a predetermined range of the temperature prior to the development. Other heating methods using a ceramic heater or a heating fun may also be applicable.

An example of a pre-heating roller contains at least one pair of rollers having a heating means inside of the roller. As a roller having a heating means inside of the roller, it may be used a roller containing a metal pipe having a high heat conductivity (e.g., aluminum and iron), inside of the pipe being provided with a heating material such as a nichrome wire and the outside of the pipe being coated with a plastic such as polyethylene, polystyrene, Teflon$^R$. The detail of a pre-heating roller may be referred to JP-A No. 64-80962.

It is preferable to carry out pre-heating at a temperature of not more than 120° C. for a period of not more than 120 seconds. More preferably, pre-heating is carried out at a temperature of 80 to 150° C. for 3 to 30 seconds.

In the invention, the imagewise exposed light sensitive layer, which are cured are at exposed portions, is developed with an alkali developer, whereby the light sensitive layer at exposed portions are removed to form an image.

As the alkali developer for the present invention, a conventional alkali aqueous solution is used. For example, there is an alkali developer containing an inorganic alkali agent such as sodium silicate, potassium silicate, ammonium silicate, sodium secondary phosphate, potassium secondary phosphate, ammonium secondary phosphate; sodium hydrogen carbonate, potassium hydrogen carbonate, ammonium hydrogen carbonate; sodium carbonate, potassium carbonate, ammonium carbonate; sodium borate, potassium borate, lithium borate; sodium hydroxide, potassium hydroxide, and ammonium hydroxide.

The alkali developer can contain organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents can be used singly or as a mixture of two or more thereof. The alkali developer can contain an anionic surfactant, an amphoteric surfactant, or an organic solvent such as alcohol.

The developer used in the invention has preferably a silic acid content of 1.0 wt % converted with $SiO_2$ and an aqueous alkali solution having a pH of more than 8.5 to less than 13.0, having and more preferably 10.0 to 12.5. The aqueous solution may contain other additives. The aqueous solution preferably contains further a surfactant in an amount of 0.1 to 5.0 wt %.

It is preferable to eliminate a protective layer with water prior to development of the planographic printing material of the present invention.

When the development is carried out using an automatic developing apparatus, the surface of the exposed planographic printing material is preferably washed with water prior to developing with the automatic developing apparatus, or the automatic developing apparatus is preferably equipped with a washing bath for pre-washing.

EXAMPLES

Next, the present invention will be explained in the following examples, but the present invention is not limited thereto. In the examples, "parts" represents "parts by weight", unless otherwise specified.

Example 1

Inventive Sample Nos. 1-11, and Comparative Sample Nos. 1-3

<Synthesis of Polymer Binder>

Methyl methacrylate of 58.0 parts (0.58 mol), 35.0 parts (0.41 mol) of methacrylic acid, 6.0 parts (0.05 mol), of ethyl methacrylate, 100 parts of ethanol, and 1.23 parts of α,α'-azobisisobutyronitrile were put in a three neck flask under nitrogen atmosphere, and reacted under nitrogen atmosphere for 6 hours at 80° C. in an oil bath.

After that, the reaction mixture was added with 1 part of triethylbenzylammonium chloride and 28.0 parts (0.2 mol) of glycidyl methacrylate (epoxy-containing unsaturated compound) and reacted at 25° C. for additional 3 hours. Thus, polymer binder A was obtained. The weight average molecular weight of the polymer binder A was. 70,000, measured according to GPC.

Polymer binders B and C were prepared in the same manner as in Polymer binder A, except that a mixture ratio pf monomers, and an addition amount of the epoxy compound for reacting with the carboxyl group were changed as shown in Table 1, and polymerization time was adjusted to give a weight average molecular weight Mw as shown in Table 1.

TABLE 1

| Polymer binder | Composition of copolymer component ratio (Mixing weight part) | | | Ratio of compound having an epoxy group and an unsaturated group (Mixing weight part) | Acid value | Weight average molecular weight (Mw) |
|---|---|---|---|---|---|---|
| | MMA | MAA | EMA | GMA | | |
| A | 58 | 35 | 6 | 28 | 95 | 70000 |
| B | 69 | 25 | 6 | 0 | 140 | 69000 |
| C | 69 | 25 | 6 | 14 | 95 | 68000 |

MMA: Methyl methacrylate,
MAA: Methacrylic acid,
EMA: Ethyl methacrylate,
GMA: Glycidyl methacrylate <Preparation of Support>

A 0.24 mm thick aluminum plate (material 1050, quality H16) was degreased at 60° C. for one minute in a 5% sodium hydroxide solution, washed with-water, immersed at 25° C. for one minute in 10% hydrochloric acid solution to neutralize, and then washed with water.

The resulting aluminum plate was electrolytically etched using an alternating current at 25° C. for 60 seconds at a current density of 100 A/dm$^2$ in a 0.3 weight % nitric acid solution, desmut at 60° C. for 10 seconds in a 5% sodium hydroxide solution. The desmut aluminum plate was anodized at 25° C. for 1 minute at a current density of 10 A/dm$^2$. Thus, support 1 was obtained. The center line average surface roughness (Ra) of the support was 0.65 μm.

<Surface Treatment of Support>

The resulting aluminum plate was successively immersed in the following solution without drying.

Temperature of the solution: 80° C.

Solution: Polyvinyl phosphonic acid (PVPA) 0.6 weght % aqueous solution

The resulting aluminum plate was immersed in the solution for 30 seconds, then washed with ion exchanged water and dried.

<Preparation of Planographic Printing Plate Material Sample>

The following light sensitive layer coating solution was coated on the resulting support through a wire bar to give a light sensitive layer having a dry thickness of 1.5 g/m$^2$, and dried at 100° C. for 1.5 minutes. After that, the following over coat layer coating solution was coated on the resulting light sensitive layer through an applicator to give an over coat layer having a dry thickness of 1.5 g/m$^2$, and dried at 75° C. for 1.5 minutes. Thus, planographic printing plate material samples were obtained, which had an over coat layer on the light sensitive layer.

(Light Sensitive Layer Coating Solution)

| | |
|---|---|
| Polymer binder (indicated in Table 2) | 45.0 parts |
| Dye (indicated in Table 2) | 2.0 parts |
| Polymerization initiator: Iron-arene compound (IRGACURE261 produced by Ciba Specialty Chemicals Co., Ltd.) | 3.2 parts |
| Polymerization initiator: Triazine compound (TAZ107 produced by Midori Kagaku Co., Ltd.) | 2.5 parts |
| Ethylenically unsaturated compound (Compound B, Tertiary amine urethane monomer) | 30.0 parts |
| Polyethylene glycol #200 dimethacrylate (NK Ester4G produced by Shinakamura Kagaku Co., Ltd.) | 15.0 parts |
| Phthalocyanine pigment (MHI454, 30% MEK dispersion produced by Mikuni Sikisosha) | 6.0 parts |
| Hindered amine photo-stabilizer (LS770, produced by Sankyo Raifutekku Co., Ltd.) | 1.0 part |
| Fluorine-contained surfactant (F178K: produced by Dainippon Ink Kagaku Kogyo Co., Ltd.) | 0.5 parts |
| Cyclohexanone (bp. 155° C.) | 820 parts |

(Overcoat Layer Coating Solution)

| | |
|---|---|
| Polyvinyl alcohol (GL-03, produced by Nippon Gosei Kagaku Co., Ltd.) | 84 parts |
| Polyvinyl pyrrolidone (K-30, produced by ISP JAPAN Co., Ltd.) | 15 parts |
| Surfactant (Surfinol465, produced by Nisshin Kagaku Kogyo Co., Ltd.) | 0.5 parts |
| Water | 900 parts |

<Image Formation>

The planographic printing plate material sample obtained above was imagewise exposed at a resolving degree of 2400 dpi, employing a CTP exposure device (Tiger Cat produced by ECRM Co., Ltd.) in which a light source emitting a 532 nm light was installed. Herein, dpi represents the dot numbers per 2.54 cm.

Subsequently, the exposed sample was subjected to development treatment employing a CTP automatic developing machine (PHW 32V produced by Technigraph Co., Ltd.) to obtain a planographic printing plate. Herein, the developing machine comprised a preheating section for preheating the exposed sample, a pre-washing section for removing the over coat layer before development, a development section charged with the following developer 1, a-washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, inventive planographic printing plate samples Nos. 1 to 11, and comparative planographic printing plate samples Nos. 1 to 3 (indicated in Table 2) were obtained.

The heating conditions were those in which the printing plate material sample was heated at a surface temperature of 105±10° C. for 15 seconds. The surface temperature was confirmed with a thermo label (produced by Nichiyu Giken Co., Ltd.), which had been adhered to the support of the sample to be heated.

Developer 1 (Aqueous Solution Containing the Following Components)

| | |
|---|---|
| Potassium silicate A | 8.0 wt % |
| New Coal B-13SN | 2.0 wt % |
| (produced by Nippon Nyukazai Co., Ltd.) | |
| Pronon #204 | 1.0 wt % |
| (produced by Nippon Yushi Co., Ltd.) | |
| Ethylenediaminetetraacetic acid disodium salt dihydrate | 0.1 wt % |
| Potassium hydroxide | Amount giving a pH of 12.3 |

<Evaluation of Planographic Printing Plate Material Sample>

The planographic printing plate material sample obtained above was evaluated according to the following methods.

<<Sensitivity>>

Density of the solid images formed on the samples obtained varying exposure energy was measured every exposure energy, and exposure energy giving a density of the maximum density minus a density of 10% of the maximum density was defined as the lowest image formation energy and evaluated as a measure of sensitivity.

<<Printing Durability 1>>

The planographic printing plate material sample was imagewise exposed at optimum exposure amount to give a 175 lines/inch image, and developed to obtain a planographic printing plate. Employing the resulting printing plate, printing was carried out on a press (DAIYA1F-1 produced by Mitsubishi Jukogyo Co., Ltd.), wherein a coat paper, printing ink (Toyo Ink Hiecho M Magenta produced by Toyo Ink Manufacturing Co., Ltd.), and dampening water (SG-51, H solution produced by Tokyo Ink Co., Ltd., Concentration: 1.5%) were used. The number of prints printed from the beginning of the printing till when dot reduction of 3% at highlight image portions or filling-up at shadow portions was observed was evaluated as a measure of printing durability 1.

<<Storage Stability>>

Each planographic printing plate material sample was stored at 55° C. and 20% RH (relative humidity) for accelerating its deterioration. Sensitivity of the resulting sample was evaluated in the same manner as above, and printing durability 1 was also evaluated, and compared with those of the sample before storage.

Ink stain appeared in the non-printed portion of the printed material produced in the $100^{th}$ printing was visually checked in a range of 100 cm² of the printed material. The evaluation was carried based on the following criteria.

A: Ink stain was not observed in the non-printed portion of the printed material B: Ink stain was observed in the non-printed portion of the printed material to a degree of unacceptable for practical use.

<<Preheating Latitude>>

Each planographic printing plate material sample was subjected to development treatment in the same manner as above, pre-heating temperature being varied. Employing the resulting printing plate, printing was carried out in the printing condition as printing durability 1, and a maximum pre-heating temperature, at which no stain was observed at exposed portions or no filling-up at shadow portions, was determined.

In this evaluation, the planographic printing plate material sample was preheated at various temperature in another heating device under safelight, and developed employing the developing machine above in which power of the preheating section was switched off.

<Development Property>

500 m² of each of the above-described printing plate materials was subjected to development treatment. After development an amount of sludge produced in the development tank and adhesion to the developed printing plate materials were checked based on the following criteria.

Adhesion of Sludge

A: No adhesion of sludge to the printing plate materials, and no problem for practical use.

B: Observed slight adhesion of sludge to the printing plate materials in the development tank, but the sludge is removed in the washing tank and there is no sludge remained at the final stage and no problem for practical use.

C: Observed a large amount of adhesion of sludge to the printing plate materials.

Each of the 100 ml of the development solution after carrying out the development was sealed hermetically and kept at 55° C. at 20% RH for 3 days. Then the solution was filtered to obtain the solid. The solid was dried at 70° C. for 1 day to give sludge.

The results ware shown in Table 2. Table 2 shows that the printing plate materials of the present invention exhibit high sensitivity, small decrease of sensitivity after storage, small ink stain, high storage stability, large latitude of pre-heating, small amount of produced sludge, demonstrating a superior development property.

TABLE 2

| Sample No. | Polymer binder | Dye | $R_1$ | MEK Solubility (%) | Sensitivity μj/cm² | Printing Durability 1 | Storage Stability — Sensitivity after storage | Storage Stability — Stain after storage | Pre-heating latitude | Development latitude — Sludge | Development latitude — Amount (g) |
|---|---|---|---|---|---|---|---|---|---|---|---|
| Comp. 1 | B | Dye1 (nonion) | | 2 | 300 | 0 | >400 | A | B: 130° C. | B | 0.25 |
| Comp. 2 | B | Dye2 (cation) | | 1 | >400 | 0 | >400 | — | B: 130° C. | B | 0.3 |
| Comp. 3 | B | Dye3 (anion) | Na | 0.5% not more than | 250 | 0 | >400 | B | B: 130° C. | B | 0.3 |
| Inv. 1 | B | Dye3 (anion) | ethyl | 1 | 100 | 70,000 | unchanged | A | A: 145° C. | A | 0.1 |
| Inv. 2 | B | Dye3 (anion) | butyl | 1.5 | 90 | 70,000 | unchanged | A | A: 160° C. | A | 0.05 |
| Inv. 3 | B | Dye3 (anion) | hexyl | 2.5 | 60 | 120,000 | unchanged | A | A: 160° C. | A | 0.05 |
| Inv. 4 | B | Dye3 (anion) | octyl | 3% not less than | 50 | 150,000 | unchanged | A | A: 160° C. | A | 0.02 |
| Inv. 5 | B | Dye3 (anion) | decyl | 3% not less than | 45 | 150,000 | unchanged | A | A: 160° C. | A | 0.02 |
| Inv. 6 | B | Dye3 (anion) | dodecyl | 3% not less than | 45 | 150,000 | unchanged | A | A: 160° C. | A | 0.05 |
| Inv. 7 | B | Dye3 (anion) | lauryl | 3% not less than | 45 | 80,000 | unchanged | A | A: 160° C. | B | 0.12 |
| Inv. 8 | B | Dye3 (anion) | phenyl | 3% not less than | 60 | 120,000 | unchanged | A | A: 160° C. | A | 0.1 |
| Inv. 9 | B | Dye3 (anion) | cyclohexyl | 3% not less than | 60 | 120,000 | unchanged | A | A: 160° C. | A | 0.08 |
| Inv. 10 | B | AD14 (anion) | — | 2 | 90 | 80,000 | unchanged | A | A: 150° C. | A | 0.08 |
| Inv. 11 | B | AD12 (anion) | — | 2 | 100 | 70,000 | unchanged | A | A: 150° C. | A | 0.1 |

Comp: Comparative sample
Inv.: Inventive sample

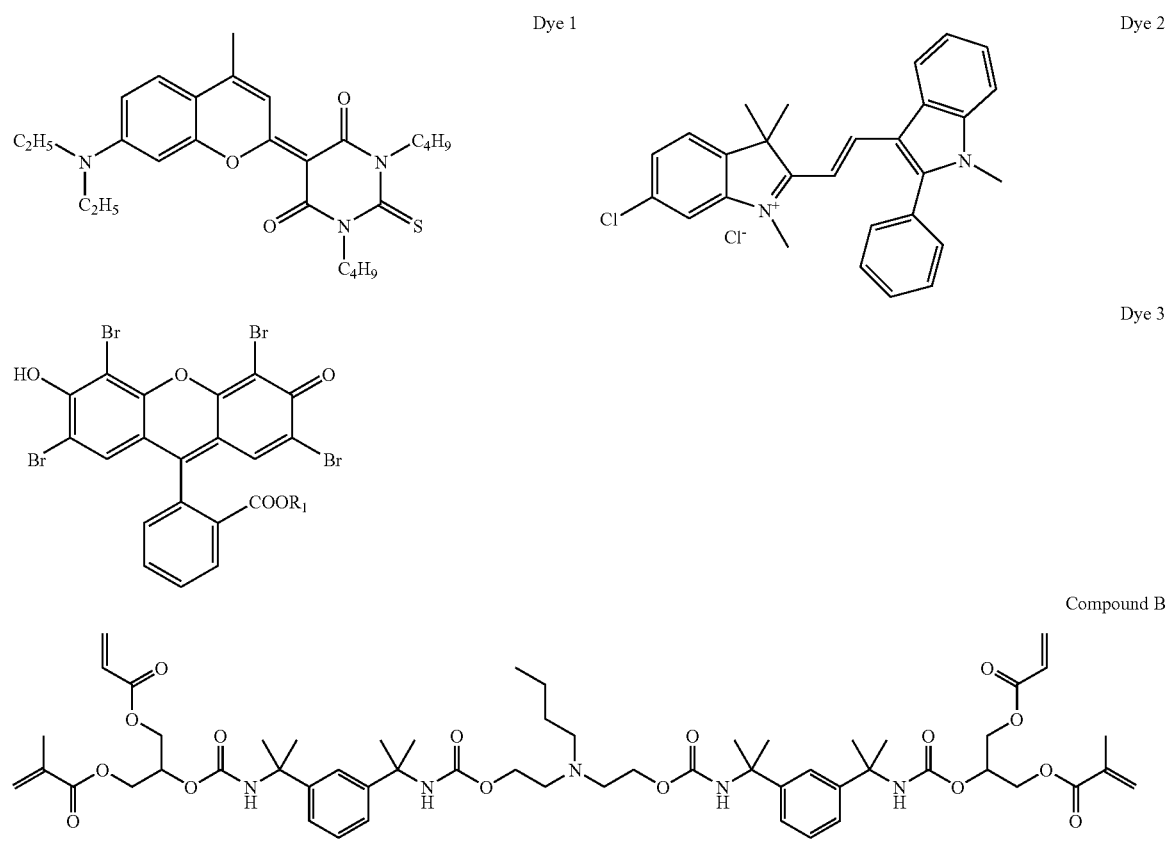

<Inventive Sample Nos. 12-28, and Comparative Sample No. 4>

Preparation of the support and surface treatment were done in the same manner as Inventive sample No. 1. Polymer binders were employed as described above.

<Preparation of Planographic Printing Plate Material Sample>

The planographic printing plate material having an over coat on the photosensitive layer was prepared in the same manner as preparing Inventive sample No. 1 except for using the light sensitive layer coating solution No. 2.

(Light Sensitive Layer Coating Solution No. 2)

| | |
|---|---|
| Polymer binder (indicated in Table 3) | 45.0 parts |
| Dye (indicated in Table 3) | 4.0 parts |
| Polymerization initiator 1: Iron-arene compound (IRGACURE261 produced by Ciba Specialty Chemicals Co., Ltd.) | 3.2 parts |
| Polymerization initiator 2 (indicated in Table 2): | 2.0 parts |
| Ethylenically unsaturated compound (Compound B, Tertiary amine urethane monomer) | 30.0 parts |
| Polyethylene glycol #2000 dimethacrylate (NK Ester4G produced by Shinakamura Kagaku Co., Ltd.) | 15.0 parts |
| Phthalocyanine pigment (MHI454, 30% MEK dispersion produced by Mikuni Sikisosha) | 6.0 parts |
| Hindered amine photo-stabilizer (LS770, produced by Sankyo Raifutekku Co., Ltd.) | 1.0 part |
| Fluorine-contained surfactant (F178K: produced by Dainippon Ink Kagaku Kogyo Co., Ltd.) | 0.5 parts |
| Cyclohexanone (bp. 155° C.) | 820 parts |
| (Overcoat Layer Coating Solution) | |
| Polyvinyl alcohol (GL-03, produced by Nippon Gosei Kagaku Co., Ltd.) | 84 parts |
| Polyvinyl pyrrolidone (K-30, produced by ISP JAPAN Co., Ltd.) | 15 parts |
| Surfactant (Fl405, produced by Dainippon Ink Kagaku Kogyo Co., Ltd.) | 0.5 parts |
| Water | 900 parts |

(Developer 2 (Aqueous Solution Containing the Following Components

| | |
|---|---|
| Potassium silicate A | 8.0 wt % |
| New Coal B-13SN (produced by Nippon Nyukazai Co., Ltd.) | 3.0 wt % |
| Ethylenediaminetetraacetic acid disodium salt dihydrate | 0.1 wt % |
| Potassium hydroxide | Amount giving a pH of 12.3 |

<Evaluation of Planographic Printing Plate Material Sample>

The planographic printing plate material sample obtained above was evaluated according to the above-described methods.

Printing durability was evaluated by changing the printing ink and the following test was added. The evaluation results were shown in Table 3.

<<Printing Durability 2>>

The planographic printing plate material sample was imagewise exposed at optimum exposure amount to give a 175 lines/inch image, and developed to obtain a planographic printing plate. Employing the resulting printing plate, printing was carried out on a press (DAIYA1F-1 produced by Mitsubishi Jukogyo Co., Ltd.), wherein a coat paper, printing ink (Bean oil ink "Naturalith 100" produced by Dainippon Ink Kagaku Kogyo Co., Ltd.), and dampening water (SG-51, H solution produced by Tokyo Ink Co., Ltd., Concentration: 1.5%) were used. The number of prints printed from the beginning of the printing till when dot reduction of 3% at highlight image portions or filling-up at shadow portions was observed was evaluated as a measure of printing durability.

Table 3 shows that the printing plate materials of the present invention exhibit high sensitivity, small decrease of sensitivity after storage, small ink stain, high storage stability, large latitude of pre-heating, small amount of produced sludge, demonstrating a superior development property.

TABLE 3

| Sample No. | Polymer binder | Intiator 2 | Dye | $R_1$ | Sensitivity $\mu j/cm^2$ | Printing Durability 1 | Durability 2 | Storage Stability Sensitivity after storage | Stain after storage | Pre-heating latitude | Development latitude Sludge | Amount (g) |
|---|---|---|---|---|---|---|---|---|---|---|---|---|
| Inv. 12 | B | TAZ110 | Dye 3 | octyl | 50 | 150,000 | 150,000 | unchanged | A | A: 160° C. | A | 0.02 |
| Inv. 13 | C | TAZ110 | Dye 3 | octyl | 45 | 200,000 | 200,000 | unchanged | A | A: 160° C. | A | 0.02 |
| Inv. 14 | A | TAZ110 | Dye 3 | octyl | 45 | 220,000 | 220,000 | unchanged | A | A: 160° C. | A | 0.02 |
| Inv. 15 | A | BMPS | Dye 3 | octyl | 30 | 400,000 | 400,000 | unchanged | A | A: 160° C. | A | 0.02 |
| Inv. 16 | A | PV-24 | Dye 3 | octyl | 40 | 400,000 | 400,000 | unchanged | A | A: 150° C. | A | 0.02 |
| Inv. 17 | A | BA5252 | Dye 3 | octyl | 30 | 400,000 | 400,000 | unchanged | A | A: 140° C. | A | 0.02 |
| Inv. 18 | A | BA5764 | Dye 3 | octyl | 45 | 300,000 | 300,000 | unchanged | A | A: 160° C. | A | 0.02 |
| Inv. 19 | A | BA5532 | Dye 3 | octyl | 30 | 400,000 | 400,000 | unchanged | A | A: 140° C. | A | 0.03 |
| Inv. 20 | A | BA4469 | Dye 3 | octyl | 40 | 400,000 | 400,000 | unchanged | A | A: 160° C. | A | 0.02 |
| Comp. 4 | A | BMPS | Dye 3 | Na | 120 | 10,000 | 10,000 | 250 | B | B: 130° C. | B | 0.3 |
| Inv. 21 | A | BMPS | Dye 3 | ethyl | 70 | 200,000 | 200,000 | unchanged | A | A: 145° C. | A | 0.1 |
| Inv. 22 | A | BMPS | Dye 3 | butyl | 50 | 250,000 | 250,000 | unchanged | A | A: 160° C. | A | 0.05 |
| Inv. 23 | A | BMPS | Dye 3 | hexyl | 40 | 400,000 | 400,000 | unchanged | A | A: 160° C. | A | 0.02 |
| Inv. 24 | A | BMPS | Dye 3 | decyl | 30 | 400,000 | 400,000 | unchanged | A | A: 160° C. | A | 0.02 |
| Inv. 25 | A | BMPS | Dye 3 | dodecyl | 30 | 400,000 | 200,000 | unchanged | A | A: 160° C. | A | 0.08 |
| Inv. 26 | A | BMPS | Dye 3 | lauryl | 35 | 400,000 | 200,000 | unchanged | A | A: 160° C. | B | 0.15 |
| Inv. 27 | A | BMPS | Dye 3 | phenyl | 40 | 200,000 | 200,000 | unchanged | A | A: 160° C. | A | 0.1 |
| Inv. 28 | A | BMPS | Dye 3 | cyclohexyl | 40 | 200,000 | 200,000 | unchanged | A | A: 160° C. | A | 0.08 |

Comp: Comparative sample
Inv.: Inventive sample
TAZ110: triazine compound (Midori chemical Co. Ltd)

PV-24

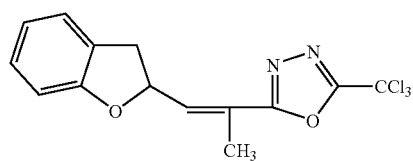

BA5252

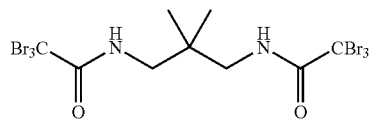

BA5764

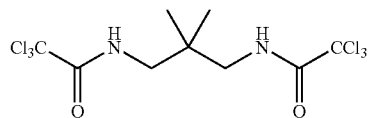

BA5532

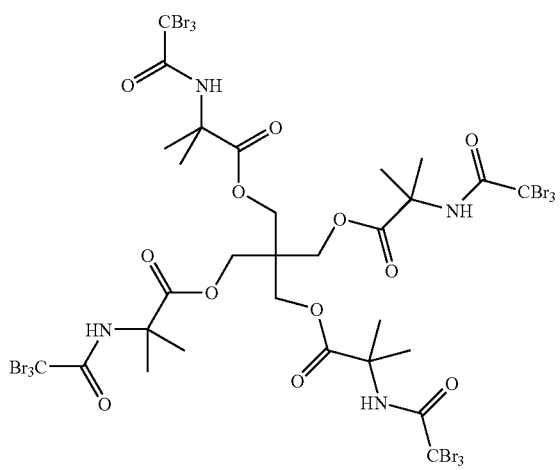

BA4469

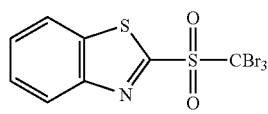

BMPS

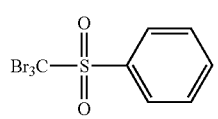

What is claimed is:

1. A planographic plate material comprising a support having thereon a photosensitive layer containing:
(A) a photopolymerization initiator;
(B) a polymer binder;
(C) a polymerizable compound having an ethylenically unsaturated bond; and
(D) an anionic dye, wherein the photopolymerization initiator is a an iron-arene complex, and the anionic dye has a solubility in methyl ethyl ketone of not less than 1 weight % based on the total weight of methyl ethyl ketone; and the anionic dye is represented by Formula (1):

Formula (1)

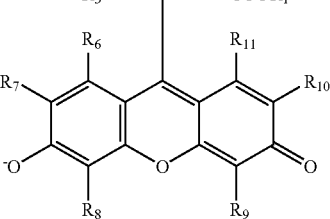

wherein $R_1$ represents a substituted or unsubstituted alkyl group of 1 to 18 carbon atoms, or a substituted or unsubstituted aryl group; $R_2$ to $R_{11}$ each independently represents a hydrogen atom, F, Cl, I, Br, a substituted or unsubstituted alkyl group of 1 to 6 carbon atoms, a substituted or unsubstituted aryl group or -N($R_{12}$) ($R_{13}$), provided that $R_{12}$ and $R_{13}$ each independently represents a substituted or unsubstituted alkyl group of 1 to 6 carbon atoms, or a substituted or unsubstituted aryl group; and $X^+$ represents a hydrogen cation, a monovalent alkali metal cation or an onium cation.

2. The planographic printing plate material of claim 1 further containing a polyhalogenated compound in the photosensitive layer as another photopolymerization initiator.

3. The planographic printing plate material of claim 2, wherein the polyhalogenated compound contains in the molecule:
a polyhalogenated acetyl amide group; or
an oxadiazole ring having a polyhalogenated methyl group.

4. The planographic printing plate material of claim 1, wherein the polymer binder is an alkali soluble polymer having an acid value of 30 to 200.

5. The planographic printing plate material of claim 1, wherein the polymerizable compound contains a tertiary amino group in the molecule.

6. The planographic printing plate material of claim 1, wherein the iron-arene compound is present in an amount of 0.1 to 20 wt % based on the total weight of the photosensitive layer.

* * * * *